United States Patent [19]
Baschirotto et al.

[11] Patent Number: 5,745,002
[45] Date of Patent: Apr. 28, 1998

[54] LOW VOLTAGE, SWITCHED CAPACITANCE CIRCUIT EMPLOYING SWITCHED OPERATIONAL AMPLIFIERS WITH MAXIMIZED VOLTAGE SWING

[75] Inventors: Andrea Baschirotto, Tortona; Rinaldo Castello, Arcore; Federico Montecchi, Pavia; Angelo Nagari, Cilavegna, all of Italy

[73] Assignee: SGS-Thomson Microelectronics, S.r.l., Agrate Brianza, Italy

[21] Appl. No.: 326,107

[22] Filed: Oct. 19, 1994

[30] Foreign Application Priority Data

Jun. 24, 1994 [EP] European Pat. Off. ............ 94830318

[51] Int. Cl.$^6$ .................... H03K 11/00; H03K 5/00
[52] U.S. Cl. .............. 327/554; 327/337; 327/45; 327/561; 330/9; 333/173; 341/172
[58] Field of Search .................... 327/336, 337, 327/561, 554, 345, 45, 91, 94, 558; 333/173, 172; 330/9, 107, 109; 341/172

[56] References Cited

U.S. PATENT DOCUMENTS 4,558,292  12/1985  Sasaki et al. .................... 333/173
4,999,634  3/1991  Brazdrum et al. .................... 341/172

OTHER PUBLICATIONS

Steyaert, et al., "Switched-Opamp, a Technique for Realising full CMOS Switched-Capacitor Filters at Very Low Voltages," 1993 ESSCIRC proceedings, pp. 178–181.

A. Baschirotto et al, "Design Strategy for Low-Voltage SC Circuits," Electronics Letters, vol. 30, No. 5, 3 Mar. 1994, pp. 378–380.

*Primary Examiner*—Timothy P. Callahan
*Assistant Examiner*—Dinh T. Le
*Attorney, Agent, or Firm*—Robert Groover; Betty Formby; Matthew S. Anderson

[57] ABSTRACT

A switched capacitance circuit, using a switched operational amplifier structure as an input switch of the switched capacitance, is provided with a new biasing circuit. An additional switched capacitor, switched alternately to power supply and to ground, is connected to the output side of the primary switched capacitor. Precision is retained while ensuring a rail-to-rail dynamic range, without requiring boosted control phases. Special arrangements may be implemented for controlling the amplitude of switching spikes when so required. A fully differential embodiment is also feasible with additional advantages.

48 Claims, 7 Drawing Sheets

LOW VOLTAGE, SWITCHED CAPACITANCE CIRCUIT EMPLOYING SWITCHED OPERATIONAL AMPLIFIERS WITH MAXIMIZED VOLTAGE SWING

CROSS-REFERENCE TO RELATED APPLICATION

This application claims priority from EP 94830318.5, filed Jun. 24, 1994, which is hereby incorporated by reference.

BACKGROUND AND SUMMARY OF THE INVENTION

The present invention relates to switched capacitance (SC) circuits, particularly for low supply voltage and low power absorption, employing a so-called switched operational amplifier structure as an input switch in order to ensure a high conductivity of the input switch under any signal condition.

Switched capacitance circuits are widely used for signal processing because of their extremely low distortion figure and because they are easily integrated. Filters of many kinds are commonly implemented by switched capacitance circuits. Fundamental functions (filtering, S&H, A/D and D/A conversion, etc.) can be efficiently implemented in CMOS technology by using SC techniques.

In low supply voltage and low current absorption applications, typically in battery powered circuits, it is often required that the circuits be powered with relatively low supply voltages, down to a level of about 1.5V. However, when operating an SC circuit from a low supply voltage, it is difficult to ensure proper opening and closing of the switches. In these conditions, ensuring an effective driving of the switches that are commonly constituted by field effect transistors (FET) and more commonly MOSFET becomes problematic. In fact, voltage Vref is made equal to Vdc-out, the maximum voltage swing that can be obtained, while ensuring the turning off of the switches, will be equal to 2 (Vref-Vdsat).

On the other hand, in order to ensure a high conductivity of the input switch, Vref must be placed at the lowest possible level for an N-channel switch or to the highest possible level for a P-channel switch. In this way though, the dynamics of the operational amplifiers (A1 and A2) employed in the circuit is markedly reduced.

In other words, the value Vdc-out is tied to the Vref value, thus imposing a compromise choice that is strictly tied to the contemplated operating conditions of the switched capacitance circuit.

Basic Innovative Circuit Ideas

The quest for a switched capacitance circuit suitable for low supply voltage and low current absorption applications which would not require boosted timing signals while ensuring under any conditions of the input signal a dynamic behavior that is practically equal to the maximum voltage swing, that is rail-to-rail dynamics, has lately brought the authors of the present invention to develop an innovative family of circuits described in the article: "Design strategy for low-voltage SC circuits", published in "Electronic Letters", 3rd March 1994, Vol. 3 no. 5, the content of which is herein incorporated by express reference. (This article is not itself prior art, but was published by the inventors of the present application.)

Basically, the solution proposed in that article, employs as an input structure a switched operational amplifier, whose input common mode voltage is made null in order to ensure not only correct operation of the switches, but also the maximum possible dynamic range. Such a null value of the input common mode voltage is imposed by a bias if the supply voltage drops to levels that are comparable with those of the threshold voltage of field effect transistors, the correct functioning of classical switched capacitance circuits, such as the integrator depicted in FIG. 1, is quickly jeopardized. In fact, in order to ensure a correct functioning of the input switch S1, the overdrive voltage of which depends on the input signal, the dynamic range of operation of the circuit is drastically reduced.

FIG. 1 shows a classical SC integrator driven by a previous stage of the same type. Switches S2, S3 and S4 are always connected to a fixed voltage (Vref or the virtual ground voltage) and so their overdrive is independent of the voltage swing. On the other hand, pass gate S1 is a critical switch, because it is connected to the output node and so its overdrive is dependent on the signal amplitude present at that point.

Known Approaches to the Problem

To guarantee for S1 a sufficiently high conductance for any signal conditions, two straightforward solutions have been proposed: either using a low threshold voltage technology (see Adachi et al., "A 1.4V switched-capacitor filter," in PROCEEDINGS OF THE CICC (Custom Integrated Circuits Conf.) at 8.2.1 ff (1993), which is hereby incorporated by reference), or by using on-chip clock voltage multiplication (see Castello et al., "A 1.5V high-performance switched-capacitor filter in BiCMOS Technology," 26 J. SOLID-STATE CIRCUITS 930 ff (1993), which is hereby incorporated by reference). However, both of these approaches are departures from standard CMOS technology, and have their own difficulties. The latter approach, though avoiding the complication of departing from the standard fabrication process for implementing low threshold integrated devices, requires the integration of dedicated voltage multipliers.

An interesting alternative approach to obtain the same goal in standard CMOS technology was proposed by Steyaert et al. and called "switched op amp". (See the paper by Steyaert et al., entitled "Switched-Op Amp, a Technique for realizing full CMOS switched-capacitor filters at very low voltages," in the 1993 ESSCIRC proceedings, which is hereby incorporated by reference.) In the resulting SC integrator, as shown in FIG. 2, the critical switch S1 is eliminated, and its function is realized instead by turning on and off the op amp through SR.

According to this new approach, in order to ensure to the switches and in particular to the input switch S1 a high conductivity under any signal situation, the MOSFET structure (typically a CMOS gate) that was conventionally used as the input switch S1 is replaced by a switched operational amplifier which is driven to turn on and off by a dedicated switch. The other switches that compose the switched capacitance structure may be realized with transistors of the same type, for example with N-channel or with P-channel transistors, without necessarily requiring the use of CMOS structures.

For illustrating this technique, FIG. 2 shows a classical switched capacitance integrator functionally equivalent to the circuit depicted in FIG. 1, wherein the function of the input transistor S1 is performed by the switched operational amplifier A1.

Although the use of a switched operational amplifier as an input switch of a switched capacitance circuit offers decisive advantages as compared with the circuits of the prior art, it cannot maximize the dynamic characteristics of the circuit under all working conditions, compatibly with the necessity of ensuring the turn-off of the switches under any conditions. By referring to the circuit of FIG. 2, if the capacitor that regulates, through a mechanism of charge injection, the virtual ground voltage, by "advance knowledge" of the output common mode voltage of the same input switched operational amplifier.

As shown in the scheme of FIG. 3 which represents an embodiment of the circuit described in the above noted article, a nullifying of the input common mode voltage is achieved by means of the additional capacitor Cdc suitable to inject electrical charge on the output node N2 of the switched capacitance C1 at every switching; the capacitor Cdc being switched by the pair of switches S5 and S6, alternatively to the supply voltage Vdd and to ground. The circuit is controlled by a pair of clock phases: 1 and 2.

With this circuit, all the switches have the maximum available overdrive voltage, while the amplifiers have an output dynamic range which is rail-to-rail (that is equal to Vdd−2V$_{sat}$). Moreover, in contrast with the solution of FIG. 2, there is no body effect associated with the switches.

Limitations of the Basic Circuit

Despite the fact that the innovative circuit of FIG. 3 is capable of ensuring a maximum dynamic range also with relatively low supply voltages without requiring the generation of boosted driving clock phases, it still presents several drawbacks.

At a certain switching instant (during an integration phase), the capacitances C1 and C2 are charged up. The capacitor C1 is charged to the voltage of the output node of the circuit, that is of the operational amplifier A2, the feedback (integrating) capacitor C2 of the operational amplifier A2 of the output structure of the circuit.

Immediately after said switching instant, the positively charged terminals of the capacitors C1 and C2 are connected to ground and therefore the other terminals of the capacitors (that is the node N1 at the start of the clock phase 1 and the node N2 at the start of the clock phase 2) are forced to assume a negative voltage (below ground).

In particular, the node N2, at the start of the control phase 2, and the output node N1 of the input operational amplifier A1, at the start of the phase 1, are forced to assume a negative voltage (below ground).

If the switches S4 and S2 are made with an N-channel field effect transistor integrated in a grounded substrate, the biasing at a negative voltage (below ground) of a current terminal of an integrated N-channel switch (transistor) causes a direct biasing of the junction between the source or drain node of the transistor and the substrate, thus causing a loss of charge (and therefore of signal) via the substrate itself.

Even if such an effect occurs only during transitions from one state to the other, the loss of signal may be sufficient to degrade the otherwise intrinsic precision of a switched capacitance circuit (SC), and this may be intolerable in many applications.

One solution to this problem of signal degradation is to dimension the Cdc capacitance in such a way as to bias the inputs of the operational amplifiers A1 and A2, respectively of the input and the output structures of the switched capacitance circuit, at a higher than zero (ground) level; but this would cause the dynamic range to be reduced.

Fully Differential Implementation

The single-phase and offset limitations of the circuit of FIG. 3 can be solved using a fully differential structure, as shown in FIG. 8. With the choice Vref=0, Vdc-in=0, Vdc-out=Vdd/2 the switch conductance remains as in the single-ended case, while the SWMAX is doubled and becomes SW$_{MAX}$=2(Vdd−2 Vsat). The fully differential solution offers a sign inversion at no extra cost, by simply crossing the signal lines. In this way higher-order structures without any extra elements can be built. Furthermore, any voltage error in the shift produced by switched-capacitor Cdc results only in a variation of the common-mode input voltage (which is rejected by the fully-differential structure) and not in any extra differential offset.

Modified Innovative Circuit

A further innovative embodiment provides an improved switched capacitance circuit, free of the above noted drawbacks and/or limitations of the known circuits.

According to a first aspect of the present invention, the output of an input switched operational amplifier structure of the switched capacitance circuit is switched to the supply voltage Vdd, instead of to ground as in the circuit described in the above noted article. This is implemented by employing a dedicated integrated P-channel switch in a substrate that is connected to the supply voltage Vdd and therefore exempt of the so-called "body effect". In this way, the output node of the input operational amplifier A1 will not assume a negative voltage during the phase of operation when the switched operational amplifier is off. Moreover, the clock phases that drive the two switches that connect the bias capacitor Cdc to the supply node and to ground (respectively), are exchanged in order to subtract instead of summing a Vdd/2 voltage.

As a consequence, both the switched capacitance C1 and eventually also the feedback capacitance of an integrating output stage (second operational amplifier) functions in a way that, during switching, the potentials of the output node of the input operational amplifier and of the output node of the switched capacitance C1 rise, thus preventing any loss of charge via the respective substrates of the integrated switches.

The capacitance Cdc, in controlling the input common mode, brings the virtual ground node to a negative value during switching, in other words, substantially generates negative spikes.

According to a further aspect of the present invention, when these negative spikes may interfere and/or be prejudicial to the correct operation of the integrated circuits as a whole, the amplitude of these spikes may be markedly reduced by adding a capacitance between the output node of the switched capacitance and ground, in order to distribute over a larger capacitance the charge injected on said node by the Cdc capacitor at the switching instants.

According to a further aspect of the present invention, the amplitude of these negative spikes may be strongly depressed by anticipating the turning on of the switched operational amplifiers and thus delaying the connection of the switched capacitance C1 to the virtual ground node. This may be easily obtained by driving the relative switches with suitably delayed (or anticipated) clock phase signals. In fact the contribution of these anticipated connections tend to rise the potential on the output node of the switched capacitance during switching. In this way, the connection of the biasing capacitor Cdc and therefore the consequent injection of charge on the output node of the switched capacitance is delayed thus regulating the input common mode while producing negative spikes of relatively reduced amplitude.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
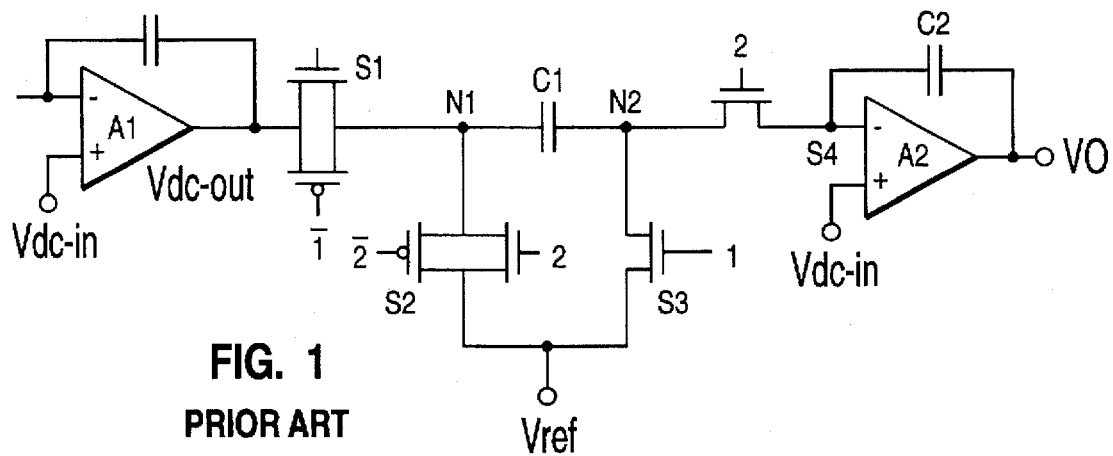
FIG. 1 shows a classic scheme of a SC integrator employing CMOS switches according to the prior art.
Figure 2:
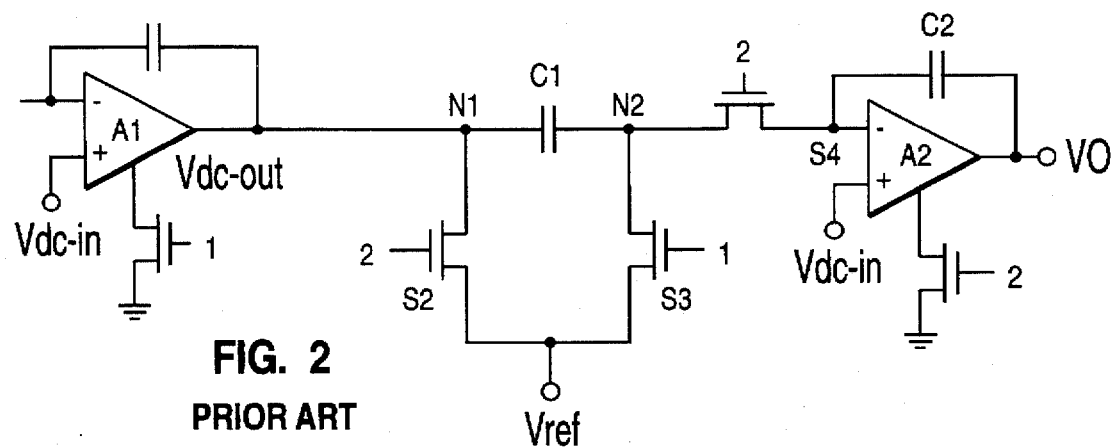
FIG. 2 shows a switched capacitance circuit functionally similar to the circuit of FIG. 1, wherein the function of the input switch is performed by a switched operational amplifier structure, according to a known technique.

The numerous innovative teachings of the present application will be described with particular reference to the presently preferred embodiment (by way of example, and not of limitation), in which:

FIGS. 1 and 2 show prior art circuits, and are described above.

Basic Circuit (First Class of Embodiments)

The innovative circuit employs as an input structure a switched operational amplifier, whose input common mode voltage is made null in order to ensure not only correct operation of the switches, but also the maximum possible dynamic range. Such a null value of the input common mode voltage is imposed by a bias capacitor that regulates, through a mechanism of charge injection, the virtual ground voltage, by "advance knowledge" of the output common mode voltage of the same input switched operational amplifier.

Figure 3:
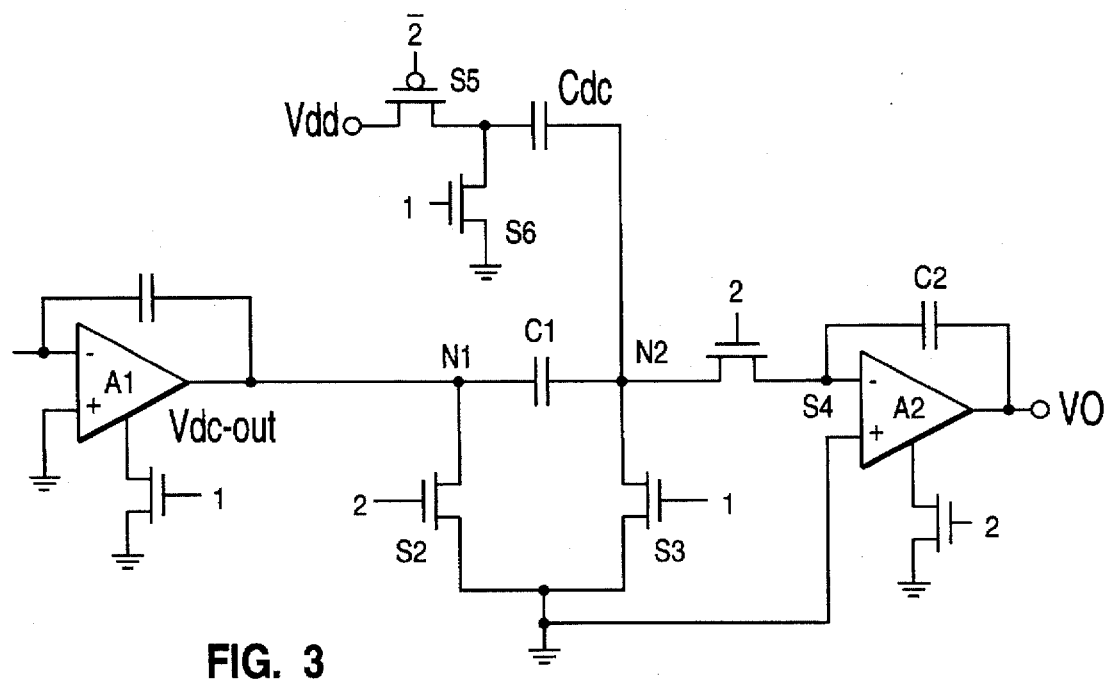
FIG. 3 shows a circuit according to a first class of innovative embodiments.

As shown in the scheme of FIG. 3 which represents an example of this class of embodiments, a nullifying of the input common mode voltage is achieved by means of the additional capacitor Cdc suitable to inject electrical charge on the output node N2 of the switched capacitance C1 at every switching; the capacitor Cdc being switched by the pair of switches S5 and S6, alternatively to the supply voltage Vdd and to ground. The circuit is controlled by a pair of clock phases 1 and 2. (Complemented phase 2\ is used to control PMOS S5.)

With this circuit, all the switches have the maximum available overdrive voltage, while the amplifiers have an output dynamic range which is rail-to-rail (that is equal to $Vdd-2V_{sat}$). Moreover, in contrast with the solution of FIG. 2, there is no body effect associated with the switches.

As explained before, the use of a switched op amp allows elimination of the critical switch S1 connected to the op amp output node which undergoes full swing. Nevertheless the values of Vref, Vdc-out and Vdc-in still need to be chosen to ensure optimum operation. To achieve maximum overdrive $V_{OV}$ for switches S2 and S3 (and consequently maximum $g_{ds}=\beta V_{ov}$), Vref should be placed as low as possible if NMOS switches are used, or as high as possible for PMOS switches. The same argument is valid for Vdc-in with respect to switch S4. On the other hand to achieve maximum output swing Vdc-out should be placed at Vdd/2 for the integrators in the network. However, the structure of FIG. 2 cannot be used to simultaneously satisfy all the above requirements, because Vdc-out=2 Vref-Vdc-out. This results since the steady-state condition (forced by the overall feedback) corresponds to having no net charge injection in each virtual ground.

The design proposed by Steyaert et al. makes the following choice: Vref=Vdc-in=Vdc-out. In choosing the value of Vref there is a tradeoff between large gds (for Vref close to ground) and large swing (for Vref close to Vdd/2): therefore a compromise between these two conflicting requirements must be accepted. Notice that using Vref≠0 results in an increase of the threshold voltage due to the body effect.

By contrast, in the innovative integrator structure of FIG. 3, VREF and Vdc-in are preferably set equal to ground. However, Vdc-out can be set independently of Vdc-in due to the extra degree of freedom given by the additional switched-capacitor Cdc. Cdc injects into the virtual ground of INT2 an amount of charge that compensates for the charge injection due to the difference between the DC output voltage of INT1 (Vdc-out) and the DC input voltage of INT2 (Vdc-in). In the steady-state condition the overall feedback forces the DC output voltage of INT1 to be equal to VddCdc/Cin. Choosing Cdc equal to Cin/2, Vdc-out of INT1 is set to Vdd/2. Because Cdc is switched from the positive supply to ground, it does not require any critical switch: S5 is a PMOS switch and S6 is an NMOS switch. It follows that both maximum gate drive for S2, S3, S4, S5 and S6 and rail-to-rail output swing can be obtained. The largest possible overdrive for a given power supply is achieved also because no body effect occurs in the threshold voltage value for both NMOS and PMOS switches (contrary to the case of the Steyaert solution). To compare the suitability of the two techniques for low-voltage operations three parameters are considered: the maximum swing ($SW_{MAX}$), the minimum Vdd for proper operation ($Vdd_{min}$), and the minimum Vdd at which approximately rail-to-rail output swing can be achieved ($Vdd_{rr}$). The two approaches are compared in terms of these three parameters in the following Table:

|  | FIG. 2 | FIG. 3 |
| --- | --- | --- |
| Vref etc.: | Vref = Vdc − in = Vdc − out. | Vref = Vdc − in = 0 <br> Vdc − out = ½ Vdd |
| $SW_{max}$: | $2(Vref - V_{sat})$ | $Vdd - 2V_{sat}$ |
| $Vdd_{min}$: | $Vref + Vth_{(Vref)} + V_{OV}$ | $Vth_{(0)} + V_{OV}$ |
| $Vdd_{rr}$: | $2(Vth_{(Vref)} + V_{OV})$ | $Vth_{(0)} + V_{OV}$ <br> $(= Vdd_{min})$ |

Figure 7:
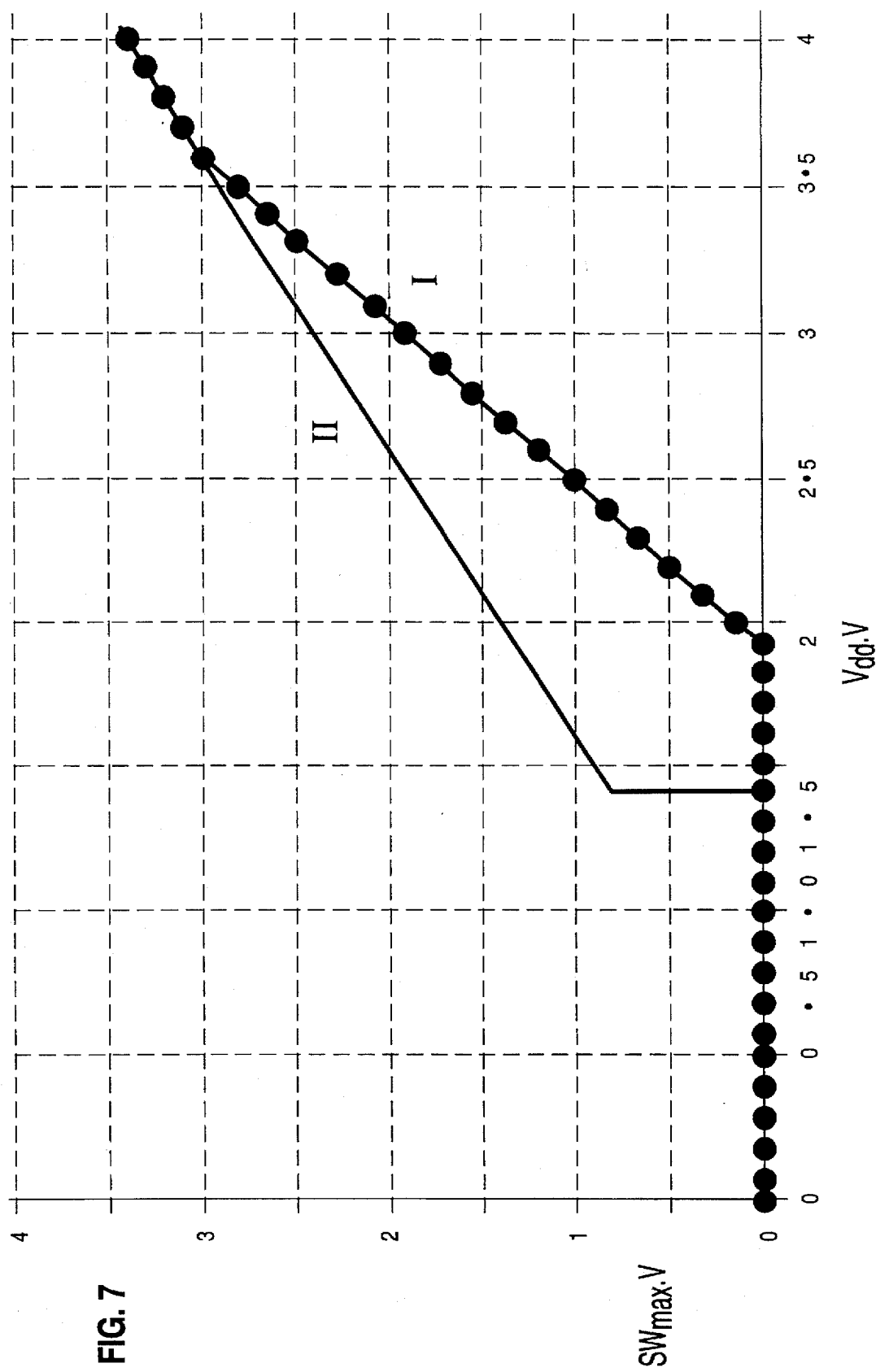
FIG. 7 graphically compares the Vdd-dependence of maximum output swing, for the two circuits of FIGS. 2 and 3.

To estimate the difference between the two solutions quantitatively, a numerical example using typical technology and design parameters is used, i.e. Vth=0.8V, $V_{OV}$=0.6V, $V_{sat}$=0.3V, $\gamma$=0.5V$^{1/2}$, $\phi$=0.3V). For the new approach proper operation starts at Vdd equal to 1.4V compared to a value of about 1.9V for the Steyaert circuit. Furthermore, whereas for the new approach at Vdd=1.4V the available swing is already 0.8V (rail-to-rail), for the Steyaert approach the swing is still zero at Vdd=1.9V. The above concepts are shown graphically in FIG. 7, which plots the maximum swing achievable against Vdd for the two cases. From FIG. 7 it can be seen that the new approach (line II) is particularly advantageous for the lower supply voltages, while the two become equivalent as the supply increases. In particular, still more than a two-fold improvement in the swing is obtained for a supply voltage equal to 2.4V.

Fully Differential Implementation

Figure 8:
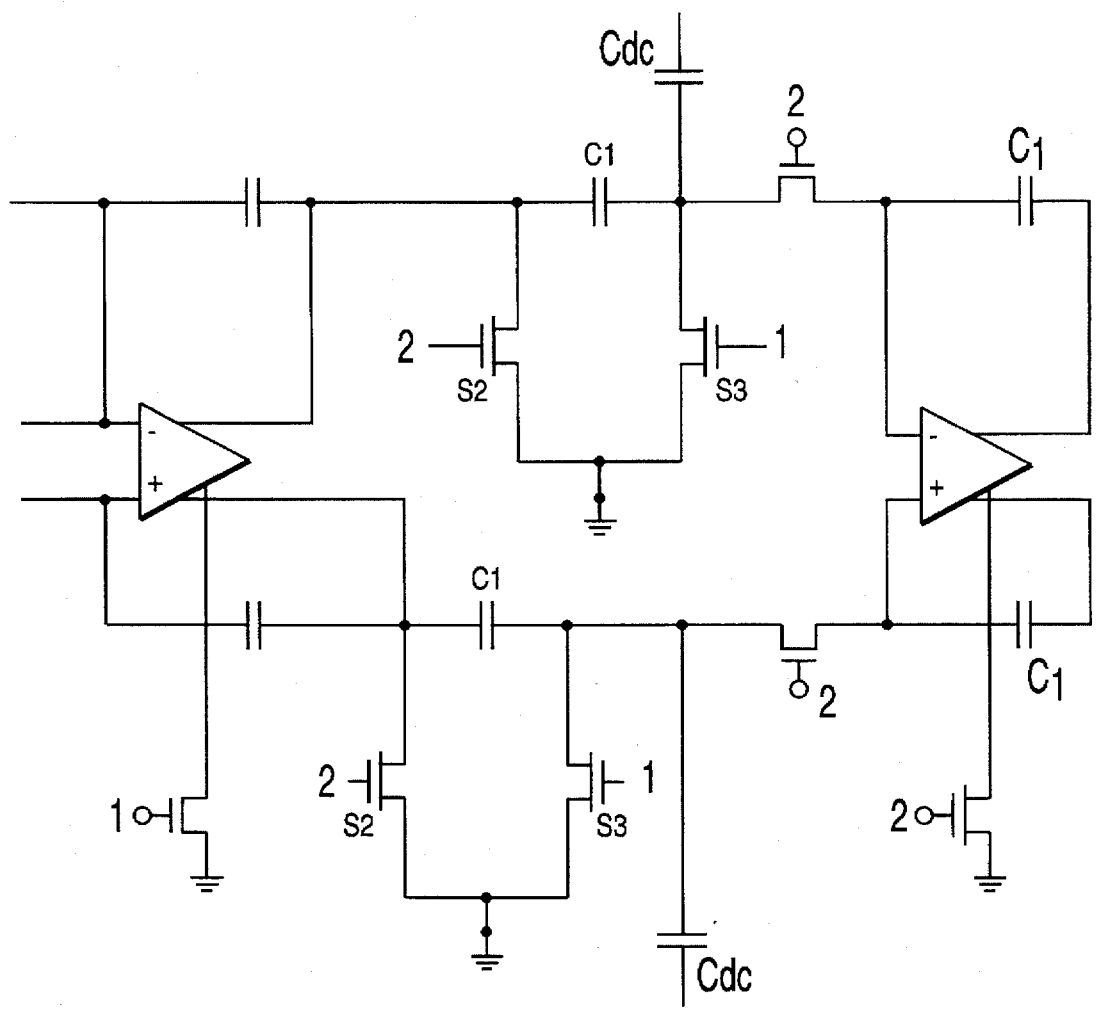
FIG. 8 shows a fully differential implementation of the circuit of FIG. 3.

FIG. 8 shows a fully differential implementation of the circuit of FIG. 3.

Improved Circuit (Second Class of Embodiments)

Figure 4:
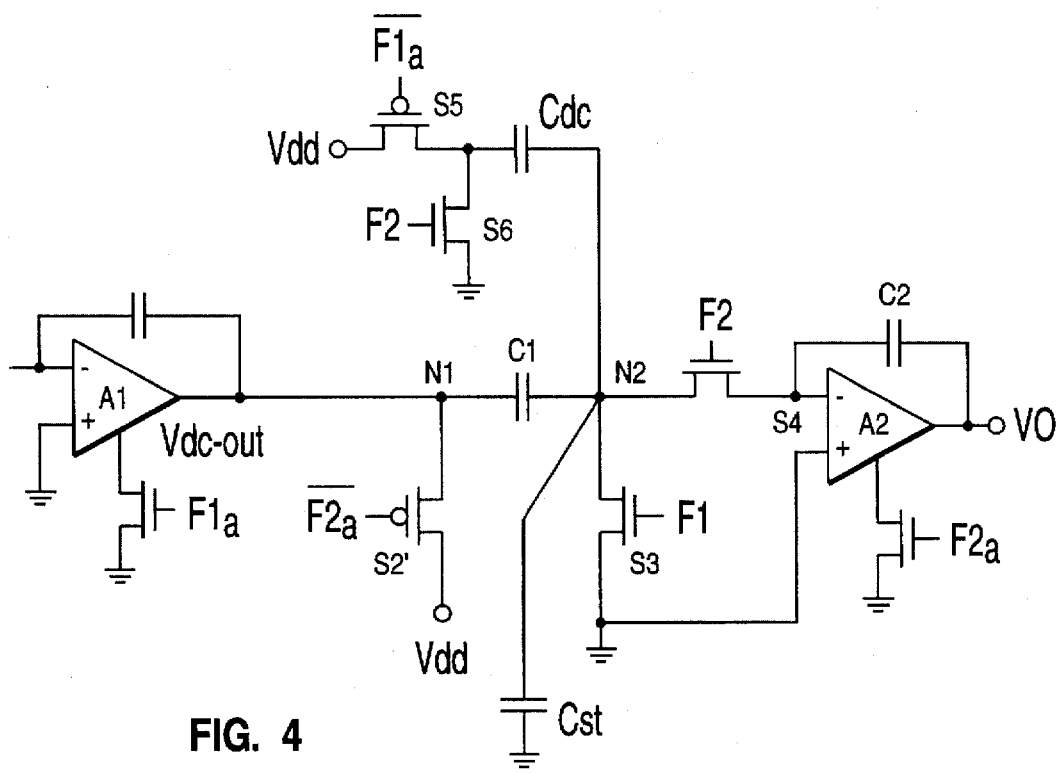
FIG. 4 is a basic diagram of a circuit made in accordance with a second class of embodiments of the present invention.

A switched capacitance integrator made according to a preferred embodiment of the present invention is depicted in FIG. 4. As may be noticed, the switch S2' connects the node N1 to the supply voltage Vdd, instead of the connection to ground provided by S2 in the circuit of FIG. 3. Moreover, the driving clock phases of the switches S5 and S6 that connects to Vdd or to ground the bias capacitor Cdc are exchanged, in order to functionally subtract a voltage equal to Vdd/2 instead of adding it as in the circuit of FIG. 3.

As a consequence, the output node N1 of the input operational amplifier A1, during a phase in which the switched operational amplifier is off, will not assume a negative (below ground) voltage but a voltage given by Vdd-Vo. In this way, the feedback capacitor C2 of the output integrating stage (that is of the second switched operational amplifier A2) will not lose any charge.

Therefore, the sampling capacitance C1 as well as the feedback capacitance C2 of the output integrating stage function in a way that, during switching, the potentials of the nodes N1 and N2 rise so as to prevent a loss of charge via the respective substrates of the switches S2', S3 and S4.

On the other hand, in fixing the input common mode, the capacitor Cdc forces the virtual ground of the operational amplifier A2 to a negative voltage (below ground) at the switching instants, thus producing negative voltage spikes. Whenever this cannot be tolerated, the amplitude of the generated spikes may be markedly reduced through the sole or combined action of other circuital arrangements of the present invention.

According to a first of these other aspects of the invention, the amplitude of the switching spikes produced by the injection of charge effected by the capacitor Cdc on the node N2 may be strongly depressed by adding a capacitor Cst, connected between the node N2 and ground, as shown in FIG. 4.

In this way the charge injected by the biasing capacitor Cdc is distributed over an augmented capacitance and therefore the node N2, at the switching instant, assumes a negative (below ground) potential but of a much reduced amplitude as compared with the one that would result without the introduction of the buffer capacitance Cst.

A further aspect of the circuit of the invention suitable to reduce the amplitude of the negative switching spikes consists in anticipating the turning on of the input switched operational amplifier A1 and of the output switched operational amplifier A2, as referred to the instant of connection to the virtual ground of the switches S2', S4 and S3.

Of course this may be easily implemented by driving the switches with clock phase signals suitably delayed in respect to the homologous clock phase signals that turn on the operational amplifiers A1 and A2 and drive the switches S5 and S2'.

Figure 5:
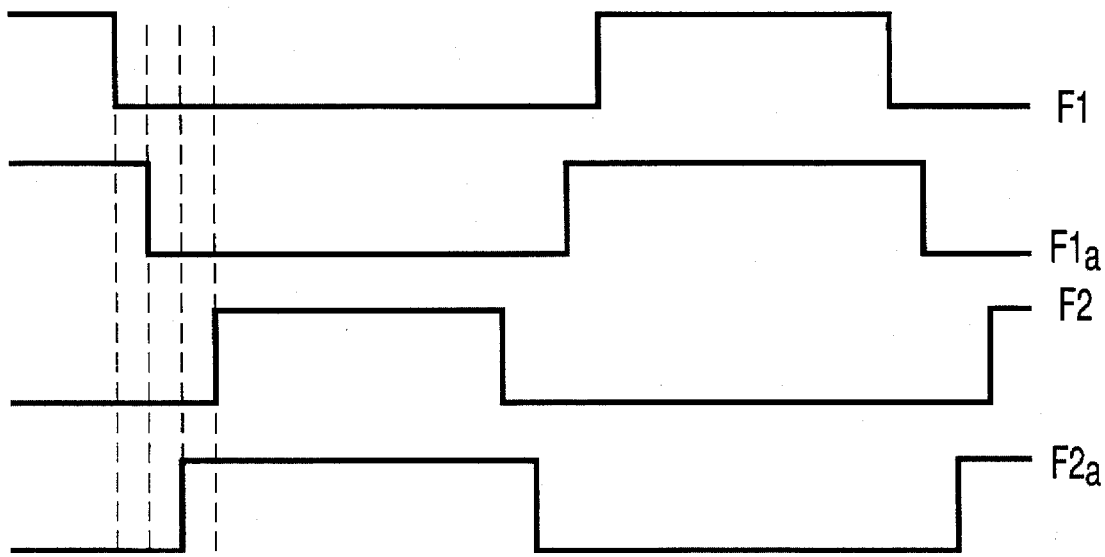
FIG. 5 is a diagram of the control clock phases of the circuit of FIG. 4, according to an embodiment of the invention.

The direct phases of the driving clock signals, according to such a preferred embodiment of the invention, are depicted in FIG. 5.

In the shown example, the switch S2' toward the supply voltage Vdd is realized with a P-channel field effect transistor having a substrate connected to the supply voltage Vdd, and therefore the transistor is not affected by the so-called "body effect".

The improved SC circuit of the invention, while functioning without requiring boosted control phases and with a maximum dynamic range (rail-to-rail) as normally contemplated in low supply voltage applications and with a reduced current absorption, retains the precision of the circuit within the limits imposed to a SC structure, by eliminating any charge loss via the substrate of turned on switches.

The switched capacitance circuit of the invention provides an output signal only during a clock phase.

Figure 6:
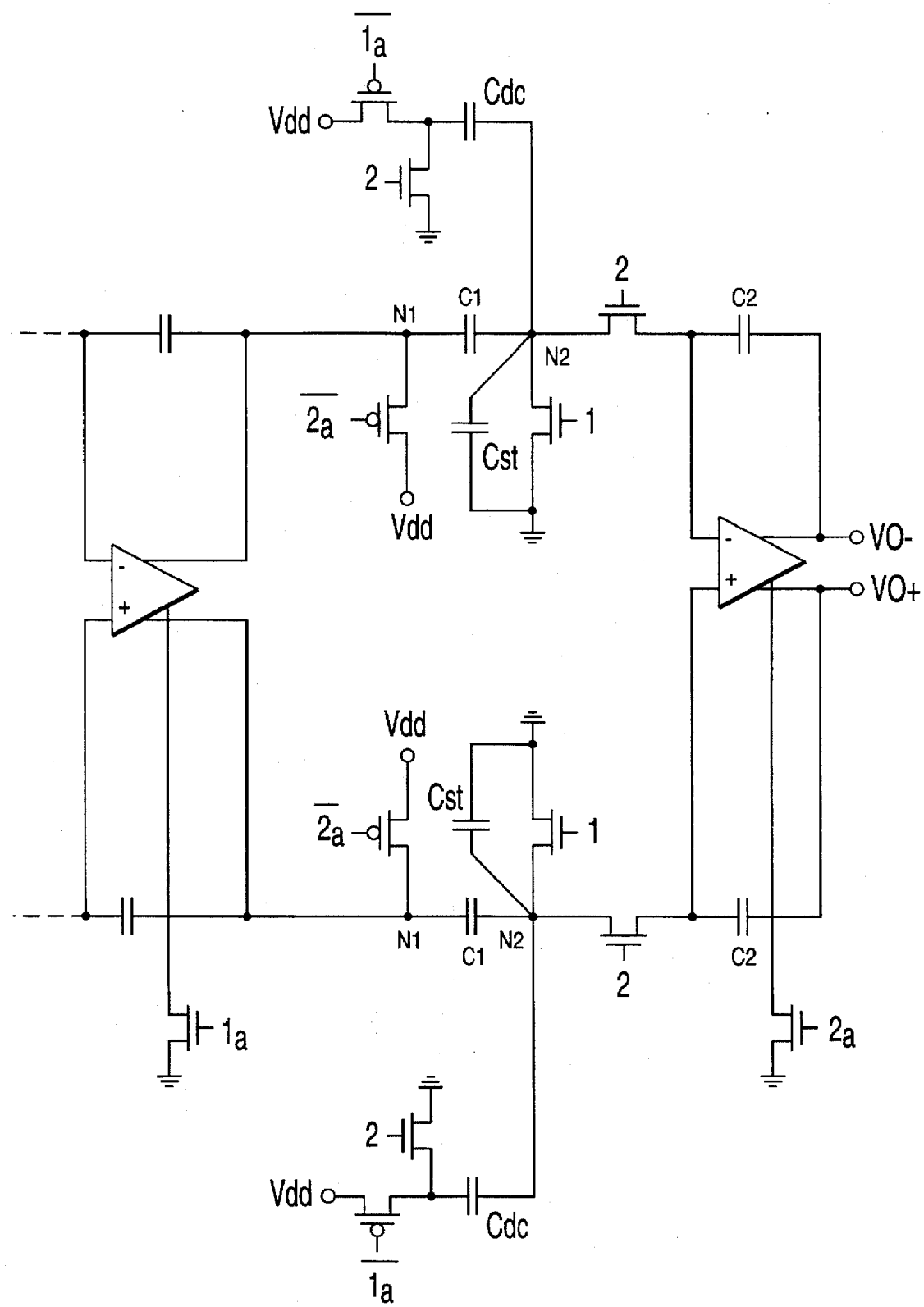
FIG. 6 is a basic diagram showing the circuit of the invention realized in a fully differential form.

In designing filters of a high order, it is often necessary to implement sign inversions by adding a further stage. Another aspect to be considered in these cases is the increase of the offset caused by the possible error that may be made in a switching phase by the charge injection Cdc. Both these limitations can be eliminated by adopting a fully differential circuit topology, as depicted in FIG. 6.

By choosing Vref=0, Vdc-in=0 and Vdc-out=Vdd/2, the dynamic range doubles as compared with the case of a single-ended circuit of FIG. 4. Moreover, the fully differential topology of the circuit intrinsically provides the option to invert the sign of the output signal by simply crossing over the signal lines. Finally, all the errors that may be caused by the switching of the switches (especially of the switches that connect the bias capacitor Cdc) may be considered as common mode, and will not influence the precision of the differential output signal.

The disclosed innovations can be advantageously used in larger circuit blocks of many types. For example, the Steyaert et al. article referenced above describes a biquad filter block; but many other blocks can also make use of the inventions. See generally Schaumann et al., *Design of Analog Filters* (1990), which is hereby incorporated by reference; *MOS Switched-Capacitor Filters* (ed. G. Moschytz 1984), which is hereby incorporated by reference; *Selected Papers on Integrated Analog Filters* (ed. G. Temes 1987), which is hereby incorporated by reference.

Figure 9:
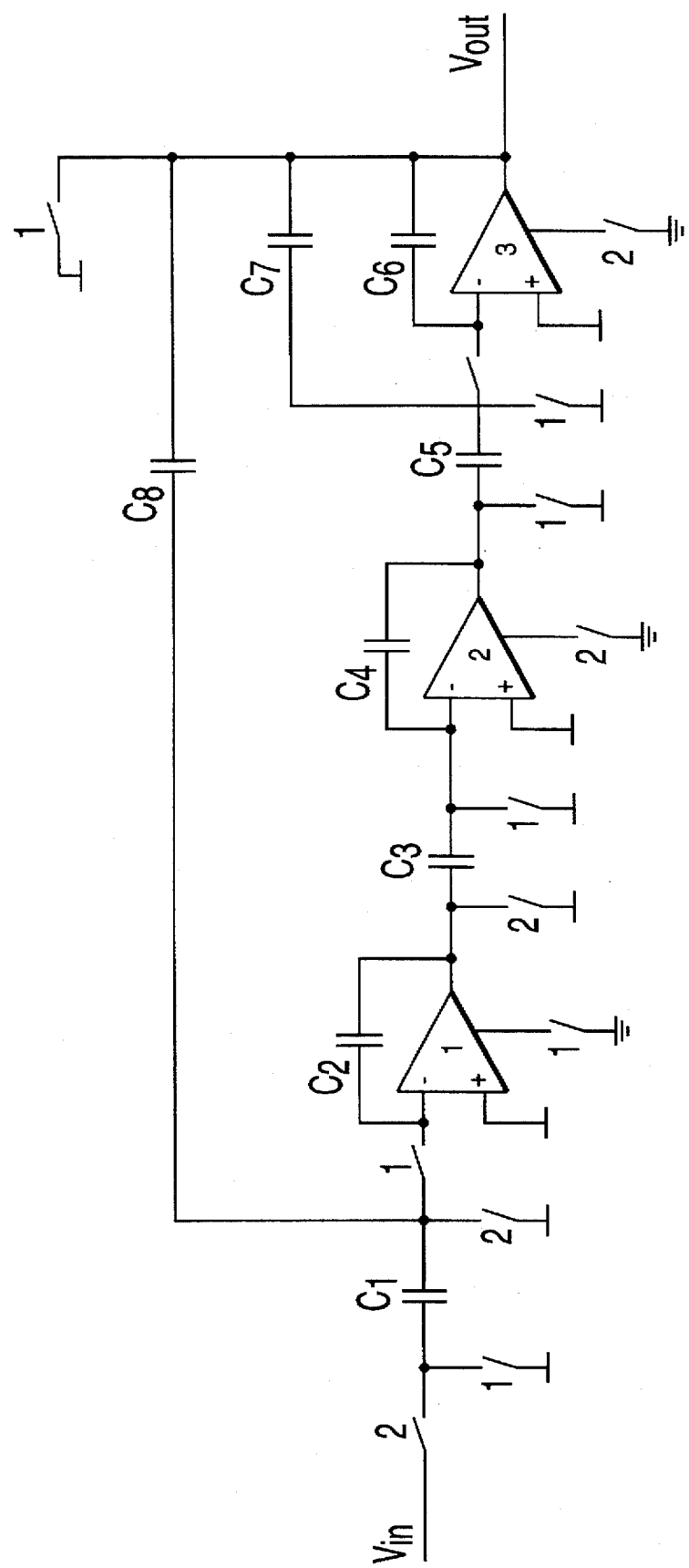
FIG. 9 shows an example of a larger circuit block in which the circuit of FIG. 3 or of FIG. 4 can be used.

FIG. 9 shows an example of a larger circuit block in which the circuit of FIG. 3 or of FIG. 4 can be used. This example is a low-pass biquad. Many other circuit configurations can be used, but this provides an example of the larger-scale feedback connections.

Figure 10:
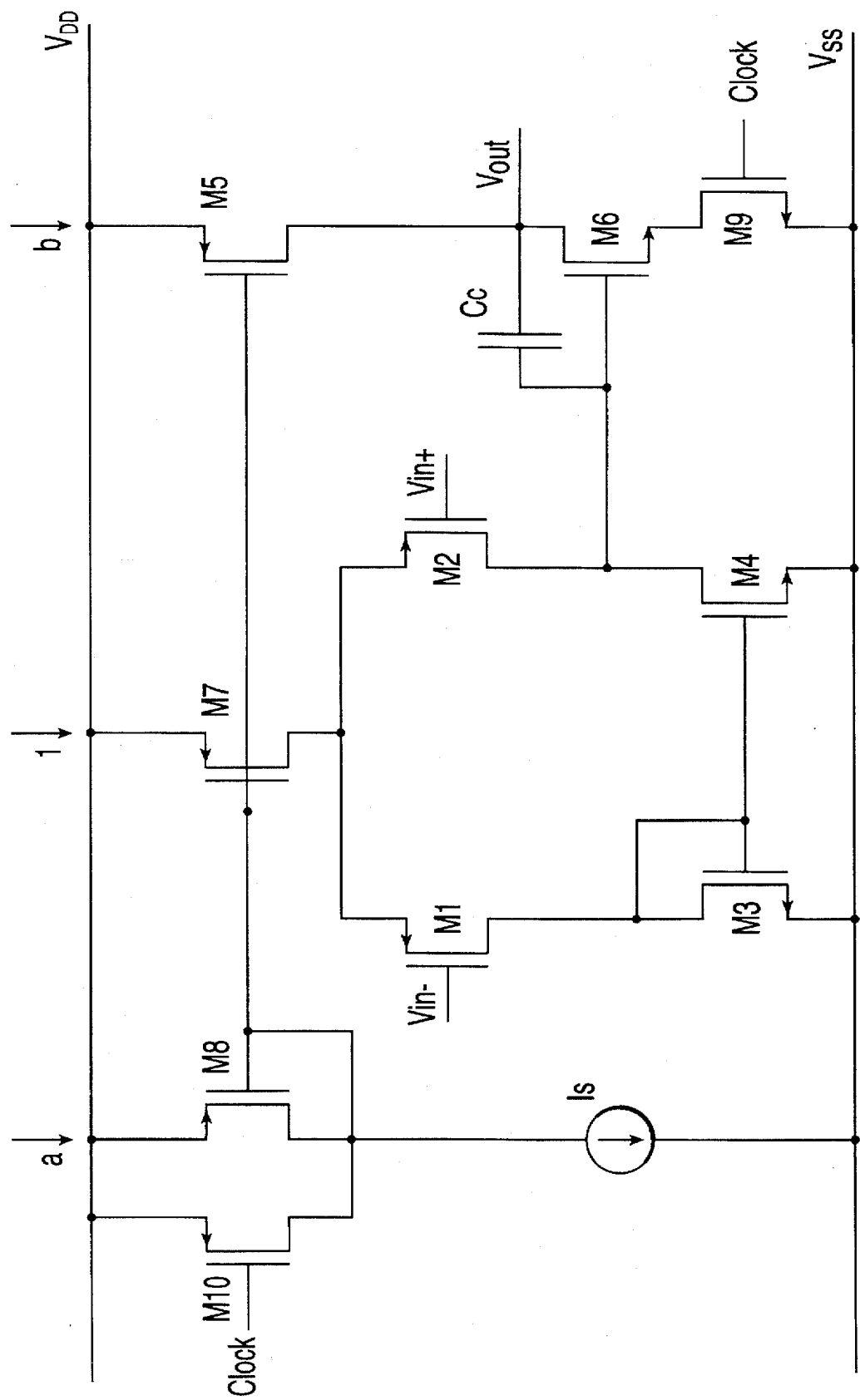
FIG. 10 shows a sample circuit topology which can be used to implement the op amps A1 and A2.

FIG. 10 shows a sample circuit topology which can be used to implement the op amps A1 and A2, but a wide variety of other circuit configurations can be used instead.

Thus according to a disclosed class of innovative embodiments, there is provided: an integrated circuit switched capacitance stage, connected to be powered from a supply voltage connection and a ground connection, comprising: a first operational amplifier connected to receive an input signal, and to intermittently drive a first terminal of a switched capacitor in dependence on said input signal, during at least a first clock phase but not during a second clock phase; a bias capacitor having one terminal thereof connected to a second terminal of said switched capacitor and the other terminal thereof switchably connected both to the supply voltage and to ground; a first switch connecting the output of said first operational amplifier to a constant voltage during at least said second clock phase but not during said first clock phase; an additional switch connected to switch said second terminal of the switched capacitance to a constant voltage during at least said first clock phase but not during said second clock phase; and a second operational amplifier operatively connected to receive the voltage on said second terminal of said switched capacitor, and to provide an output signal accordingly during at least said second clock phase but not during said first clock phase; whereby said bias capacitor biases the output voltage of said first operational amplifier toward a value intermediate between the supply voltage and ground.

According to another disclosed class of innovative embodiments, there is provided: an integrated switched capacitance circuit, connected to be powered from a supply voltage connection and a ground connection, comprising: a first switched operational amplifier connected to receive an input signal, and to intermittently drive a first terminal of a switched capacitor; a bias capacitor having one terminal thereof connected to a second terminal of said switched capacitor and the other terminal thereof switchably connected both to the supply voltage and to ground; a first switch connecting the output of said first operational amplifier to a constant voltage during a turn-off phase of said operational amplifier; an additional switch connected to switch said second terminal of the switched capacitance to ground during a turn-on phase of said operational amplifier; whereby said bias capacitor biases the output voltage of said first operational amplifier toward a value intermediate between the supply voltage and ground.

According to another disclosed class of innovative embodiments, there is provided: an integrated circuit switched capacitance differential stage, connected to be powered from a supply voltage connection and a ground connection, comprising: a first operational amplifier connected to receive a differential input signal, and to intermittently provide a differential output signal in dependence on said input signal, during at least a first clock phase but not during a second clock phase; first and second circuit branches, each including a respective switched capacitor having a first terminal connected to be driven by a respective side of said differential output signal, and a respective bias capacitor having one terminal thereof connected to a second terminal of said respective switched capacitor, and the other terminal thereof switchably connected both to the supply voltage and to ground, a respective first switch connecting the output of said first operational amplifier to a constant voltage during at least said second clock phase but not during said first clock phase; an additional respective switch connected to switch said second terminal of the switched capacitance to a constant voltage during at least said first clock phase but not during said second clock phase; and a second operational amplifier connected to receive the voltage on said second terminal of both said switched capacitors as a differential input, and to provide an output signal accordingly, during at least said second clock phase but not during said first clock phase; whereby said bias capacitor biases the output voltage of said first switched operational amplifier toward a value intermediate between the supply voltage and ground.

According to another disclosed class of innovative embodiments, there is provided: a switched capacitance circuit functioning with unboosted clock phases comprising: a switched operational amplifier as an input switch of a switched capacitance; means for freeing the definable level of the output DC voltage of said switched operational amplifier from a predefined value of a reference voltage of discharge of the switched capacitance and to fix said level of the output DC voltage of said operational amplifier to a value corresponding to about half the supply voltage, said means comprising a bias capacitor having one terminal thereof connected to the output of said switched capacitance and the other terminal thereof connectable through a first switch to the supply node and through a second switch to ground, a third switch switching the output of said switched operational amplifier to the supply voltage during a turn-off phase of said operational amplifier; a fourth switch switching said output node of the switched capacitance to ground during a turn-on phase of said operational amplifier.

According to another disclosed class of innovative embodiments, there is provided: a method for operating a switched-capacitor filter stage, comprising the steps of: providing an input signal to a first operational amplifier which is connected to intermittently drive a first terminal of a switched capacitor in dependence on said input signal; alternately performing the steps of amplifying the voltage on said switched capacitor, and providing a further output signal accordingly, and connecting said switched capacitor to a reference voltage; and providing a bias capacitor having one terminal thereof connected to said switched capacitor, and alternately connecting the other terminal of said bias capacitor to the supply voltage and to ground; whereby said bias capacitor biases the output voltage of said first switched operational amplifier toward a value intermediate between the supply voltage and ground.

According to another disclosed class of innovative embodiments, there is provided: a method for operating a switched-capacitor filter stage, comprising the steps of: providing an input signal to a first operational amplifier which is connected to intermittently drive a first terminal of a switched capacitor in dependence on said input signal, during at least a first clock phase but not during a second clock phase; providing a bias capacitor having one terminal thereof connected to a second terminal of said switched capacitor, and alternately connecting the other terminal of said bias capacitor to the supply voltage and to ground; connecting the output of said first operational amplifier to a constant voltage during at least said second clock phase but not during said first clock phase; connecting said second terminal of said switched capacitance to a constant voltage during at least said first clock phase but not during said second clock phase; and amplifying the voltage on said second terminal of said switched capacitor, and providing an output signal accordingly, during at least said second clock phase but not during said first clock phase; whereby said bias capacitor biases the output voltage of said first switched operational amplifier toward a value intermediate between the supply voltage and ground.

According to another disclosed class of innovative embodiments, there is provided: a method for operating a switched-capacitor filter stage, comprising the steps of: providing an input signal to a first operational amplifier which is connected to intermittently drive a first terminal of a switched capacitor in dependence on said input signal, during at least a first clock phase but not during a second clock phase; providing a bias capacitor having one terminal thereof connected to a second terminal of said switched capacitor, and alternately connecting the other terminal of said bias capacitor to the supply voltage and to ground;

amplifying the voltage on said second terminal of said switched capacitor, and providing an output signal accordingly, during at least said second clock phase but not during said first clock phase; whereby said bias capacitor biases the output voltage of said first switched operational amplifier toward a value intermediate between the supply voltage and ground.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

In applying the innovations to more complex switched-capacitor circuits, it is preferable to use a bias stage like Cdc at every switched-capacitor stage. For example, if the illustrated configuration were modified by adding a second integrator stage following op-amp A2, then an additional bias stage like Cdc would preferably be added at the input of the added second integrator stage.

What is claimed is:

1. An integrated circuit switched capacitance stage, connected to be powered from a supply voltage and a ground, comprising;
   a first operational amplifier connected to receive an input signal, and to intermittently drive a first terminal of a switched capacitor in dependence on said input signal, during at least a first clock phase but not during a second clock phase;
   a bias capacitor having one terminal thereof connected to a second terminal of said switched capacitor and the other terminal thereof switchably connected both to the supply voltage and to the ground;
   a first switch connecting the output of said first operational amplifier to a first constant voltage during at least said second clock phase but not during said first clock phase;
   an additional switch connected to switch said second terminal of the switched capacitor to a second constant voltage during at least said first clock phase but not during said second clock phase; and
   a second operational amplifier operatively connected to receive a voltage on said second terminal of said switched capacitor, and to provide an output signal on an output of said second operational amplifier accordingly during at least said second clock phase but not during said first clock phase;
   whereby said bias capacitor biases an output voltage of said first operational amplifier toward a value intermediate between the supply voltage and the ground for providing a maximum voltage swing.

2. The integrated circuit of claim 1, wherein said other terminal of said bias capacitor is connected to said power supply during said first clock phase, and to ground during said second clock phase.

3. The integrated circuit of claim 1, wherein said first switch consists of a single transistor.

4. The integrated circuit of claim 1, further comprising a further capacitor connected between said output of said second operational amplifier and an inverting input of said second operational amplifier.

5. The integrated circuit of claim 1, further comprising a further capacitor connected between said output of said first operational amplifier and an inverting input of said first operational amplifier.

6. The integrated circuit of claim 1, wherein said output signal of said second operational amplifier is differential.

7. The integrated circuit of claim 1, wherein said additional switch is on during at least a third clock phase which is not part of said first clock phase nor of said second clock phase.

8. The integrated circuit of claim 1, wherein said first constant voltage is ground.

9. The integrated circuit of claim 1, wherein said first constant voltage is the supply voltage.

10. The integrated circuit of claim 1, wherein said second constant voltage is ground.

11. The integrated circuit of claim 1, wherein said additional switch is bypassed by an additional capacitor.

12. The integrated circuit of claim 1, wherein said bias capacitor biases an output voltage of said first operational amplifier toward a value approximately halfway between the supply voltage and ground.

13. The integrated circuit of claim 1, further comprising a further switch interposed between said second terminal of said switched capacitor and said second operational amplifier, said further switch being on during at least a second clock phase but not during a first clock phase.

14. An integrated switched capacitance circuit, connected to be powered from a supply voltage and a ground, comprising:
   a first switched operational amplifier connected to receive an input signal, and to intermittently drive a first terminal of a switched capacitor;
   a bias capacitor having one terminal thereof connected to a second terminal of said switched capacitor and the other terminal thereof switchably connected both to the supply voltage and to the ground;
   a first switch connecting the output of said first operational amplifier to a first constant voltage during a turn-off phase of said operational amplifier;
   an additional switch connected to switch said second terminal of the switched capacitor to ground during a turn-on phase of said operational amplifier;
   whereby said bias capacitor biases an output voltage of said first operational amplifier toward a value intermediate between the supply voltage and the ground for providing a maximum voltage swing.

15. The integrated circuit of claim 14, wherein said other terminal of said bias capacitor is connected to said power supply during said first clock phase, and to ground during said second clock phase.

16. The integrated circuit of claim 14, wherein said first constant voltage is ground.

17. The integrated circuit of claim 14, wherein said first constant voltage is the supply voltage.

18. The integrated circuit of claim 14, wherein said additional switch is an NMOS transistor having a source terminal thereof connected to ground.

19. The integrated circuit of claim 14, wherein said additional switch is bypassed an additional capacitor.

20. The integrated circuit of claim 14, wherein said bias capacitor biases an output voltage of said first operational amplifier toward a value approximately halfway between the supply voltage and ground.

21. An integrated circuit switched capacitance differential stage, connected to be powered from a supply voltage and a ground, comprising:
   a first fully differential amplifier connected to receive respective differential input signals, and to provide respective differential output signals in dependence on said respective input signals, during at least a first clock phase but not during a second clock phase;

first and second circuit branches, each including
  a respective switched capacitor having a first terminal connected to be driven by a respective side of said differential output signal, and
  a respective bias capacitor having one terminal thereof connected to a second terminal of said respective switched capacitor, and the other terminal thereof switchably connected both to the supply voltage and to ground,
  a respective first switch connecting an output of said first fully differential amplifier to a first constant voltage during at least said second clock phase but not during said first clock phase;
  an additional respective switch connected to switch said second terminal of said respective switched capacitor to a second constant voltage during at least said first clock phase but not during said second clock phase; and
  a second fully differential amplifier connected to receive a respective voltage on said second terminal of each of said respective switched capacitors and to provide a respective output signal accordingly, during at least said second clock phase but not during said first clock; whereby said respective bias capacitor biases a respective output voltage of said first switched operational amplifier toward a value intermediate between the supply voltage and the around for providing a maximum voltage swing.

22. The integrated circuit of claim 21, wherein said other terminal of each said respective bias capacitor is connected to said power supply during said first clock phase, and to the ground during said second clock phase.

23. The integrated circuit of claim 21, wherein each said respective first switch consists of a single transistor.

24. The integrated circuit of claim 21, wherein said respective output signal of said second fully differential amplifier is differential.

25. The integrated circuit of claim 21, wherein each said respective additional switch is on during at least a third clock phase which is neither part of said first clock phase nor of said second clock phase.

26. The integrated circuit of claim 21, wherein said first constant voltage is the ground.

27. The integrated circuit of claim 21, wherein said first constant voltage is the supply voltage.

28. The integrated circuit of claim 21, wherein said second constant voltage is the ground.

29. The integrated circuit of claim 21, wherein each said respective additional switch is bypassed by a respective additional capacitor.

30. The integrated circuit of claim 21, wherein each said respective bias capacitor biases an output voltage of said first operational amplifier toward a value approximately halfway between the supply voltage and the ground.

31. The integrated circuit of claim 21, wherein each said branch further comprises a respective further switch interposed between said second terminal of said respective switched capacitor and said second fully differential amplifier, said further switch being on during at least a second clock phase but not during a first clock phase.

32. A switched capacitance circuit comprising:
  a first switched operational amplifier receiving an input signal and connected to an input of a switched capacitor;
  a first means for biasing a first output DC voltage of said first switched operational amplifier and for setting a level of said first output DC voltage of said first switched operational amplifier to a value about half of a supply voltage, said first means comprising a bias capacitor having one terminal thereof connected to an output of said switched capacitor and the other terminal thereof connected through a first switch to a power supply and through a second switch to ground;
  a third switch switching an output of said first switched operational amplifier to the supply voltage during a turn-off phase of said first switched operational amplifier; and
  a fourth switch switching said output of the switched capacitor to the ground during a turn-on phase of said first switched operational amplifier; whereby said bias capacitor biases said output DC voltage of said first switched operational amplifier toward a value intermediate between the supply voltage and the ground for providing a maximum voltage swing.

33. The circuit of claim 32, further comprising a buffer capacitor connected between said output of the switched capacitor and the ground.

34. The circuit of claim 32, further comprising an output switched amplifier composed of a second switched operational amplifier having a non inverting input connected to the ground and an inverting input functionally connected to said output of the switched capacitor through a fifth switch.

35. The circuit of claim 34, wherein each of said first switch and said third switch is realized with a P-channel field effect transistor, and each of said second, fourth, and fifth switches is realized with an N-channel field effect transistor.

36. The circuit of claim 32, wherein said first switched operation amplifier is a fully differential amplifier having said first and a second output DC voltage, said circuit further comprising a second means for biasing said second output DC voltage of said switched operational amplifier and for setting the level of said second output DC voltage of said first switched operational amplifier to a value about half of said supply voltage.

37. A method for operating a switched-capacitor filter stage, comprising the steps of:
  (a.) providing an input signal to a first operational amplifier which is connected to drive a first terminal of a switched capacitor in dependence on said input signal;
  (b.) alternately performing the steps of
    (i.) integrating an output voltage of said switched capacitor, and providing a further output signal accordingly, and
    (ii.) connecting said switched capacitor to a reference voltage; and
  (c.) biasing a bias capacitor having one terminal thereof connected to a second terminal of said switched capacitor, and alternately connecting the other terminal of said bias capacitor to a supply voltage and to ground; whereby said bias capacitor biases an output voltage of said first switched operational amplifier toward a value intermediate between the supply voltage and the ground for providing a maximum voltage swing.

38. The method of claim 37, wherein said other terminal of said bias capacitor is connected to said power supply during said first clock phase, and to ground during said second clock phase.

39. The method of claim 37, wherein said first and second clock phases are strictly non-overlapping.

40. The method of claim 37, wherein said bias capacitor biases an output voltage of said first operational amplifier toward a value approximately halfway between the supply voltage and ground.

41. A method for operating a switched-capacitor filter stage, comprising the steps of:

(a.) providing an input signal to a first operational amplifier which is connected to drive a first terminal of a switched capacitor in dependence on said input signal, during at least a first clock phase but not during a second clock phase;

(b.) biasing a bias capacitor having one terminal thereof connected to a second terminal of said switched capacitor, and alternately connecting the other terminal of said bias capacitor to a supply voltage and to ground;

(c.) connecting an output of said first operational amplifier to a first constant voltage during at least said second clock phase but not during said first clock phase;

(d.) connecting said second terminal of said switched capacitor to a second constant voltage during at least said first clock phase but not during said second clock phase; and (e.) integrating an output voltage of said second terminal of said switched capacitor, and providing an output signal accordingly, during at least said second clock phase but not during said first clock phase;

whereby said bias capacitor biases an output voltage of said first switched operational amplifier toward a value intermediate between the supply voltage and the ground for providing a maximum voltage swing.

42. The method of claim 41, wherein said other terminal of said bias capacitor is connected to said power supply during said first clock phase, and to ground during said second clock phase.

43. The method of claim 41, wherein said bias capacitor biases an output voltage of said first operational amplifier toward a value approximately halfway between the supply voltage and ground.

44. A method for operating a switched-capacitor filter stage, comprising the steps of:

(a.) providing an input signal to a first operational amplifier which is connected to drive a first terminal of a switched capacitor in dependence on said input signal, during at least a first clock phase but not during a second clock phase;

(b.) biasing a bias capacitor having one terminal thereof connected to a second terminal of said switched capacitor, and alternately connecting the other terminal of said bias capacitor to a supply voltage and to ground; and (c.) integrating a voltage of said second terminal of said switched capacitor, and providing an output signal accordingly, during at least said second clock phase but not during said first clock phase;

whereby said bias capacitor biases an output voltage of said first switched operational amplifier toward a value intermediate between the supply voltage and the ground for providing a maximum voltage swing.

45. The method of claim 44, further comprising the additional steps of connecting the output of said first operational amplifier to the ground during at least said second clock phase but not during said first clock phase; and connecting said second terminal of said switched capacitor to a constant voltage during at least said first clock phase but not during said second clock phase.

46. The method of claim 44, wherein said other terminal of said bias capacitor is connected to said power supply during said first clock phase, and to ground during said second clock phase.

47. The method of claim 44, wherein said first and second clock phases are strictly non-overlapping.

48. The method of claim 44, wherein said bias capacitor biases an output voltage of said first operational amplifier toward a value approximately halfway between the supply voltage and ground.

* * * * *

UNITED STATES PATENT AND TRADEMARK OFFICE
CERTIFICATE OF CORRECTION

PATENT NO. : 5,745,002
DATED : April 28, 1998
INVENTOR(S) : Andrea Baschirotto, Rinaldo Castello, Federico Montecchi, Angelo Nagari It is certified that error appears in the above-identified patent and that said Letters Patent is hereby corrected as shown below:

On the title page item:

[30] Foreign Application Priority Data     Strike:
      "94830318"

Insert:
-- 94830318.5 --

Column 13, Line 28     Strike:
      "around"

Insert:
-- ground --

Signed and Sealed this

First Day of September, 1998

Attest:

BRUCE LEHMAN

Attesting Officer     Commissioner of Patents and Trademarks